(12) United States Patent
Pelloie et al.

(10) Patent No.: US 9,871,039 B2
(45) Date of Patent: Jan. 16, 2018

(54) RESISTANCE MITIGATION IN PHYSICAL DESIGN

(71) Applicant: ARM Limited, Cambridge (GB)

(72) Inventors: Jean-Luc Pelloie, Grenoble (FR); Marlin Wayne Frederick, Jr., Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/981,449

(22) Filed: Dec. 28, 2015

(65) Prior Publication Data

US 2017/0186745 A1   Jun. 29, 2017

(51) Int. Cl.
| | | |
|---|---|---|
| H01L 21/70 | (2006.01) | |
| H01L 27/088 | (2006.01) | |
| H01L 25/00 | (2006.01) | |
| G06F 17/50 | (2006.01) | |
| H01L 27/092 | (2006.01) | |
| H01L 21/8238 | (2006.01) | |
| H01L 23/522 | (2006.01) | |
| H01L 23/528 | (2006.01) | |
| H01L 27/02 | (2006.01) | |

(52) U.S. Cl.
CPC .... *H01L 27/092* (2013.01); *H01L 21/823871* (2013.01); *H01L 23/528* (2013.01); *H01L 23/5226* (2013.01); *H01L 27/0207* (2013.01)

(58) Field of Classification Search
CPC ........... H01L 27/092; H01L 21/823871; H01L 27/0207; H01L 23/528; H01L 23/5226
USPC .................. 257/369, 401; 326/101; 716/119; 438/283
See application file for complete search history.

(56) References Cited

U.S. PATENT DOCUMENTS

| | | | | |
|---|---|---|---|---|
| 2006/0131575 | A1* | 6/2006 | Okuno | .................. G06F 11/006 257/48 |
| 2006/0164130 | A1* | 7/2006 | Yoshida | .............. H01L 27/0207 327/85 |
| 2008/0105929 | A1* | 5/2008 | Eimitsu | ............. H01L 27/11807 257/390 |
| 2010/0155783 | A1* | 6/2010 | Law | ..................... H01L 27/0207 257/206 |
| 2012/0081150 | A1  | 4/2012 | Pelloie | |
| 2013/0162293 | A1* | 6/2013 | Lilja | .................... H03K 19/215 326/54 |
| 2014/0124868 | A1* | 5/2014 | Kamal | ................ H01L 27/0207 257/369 |

* cited by examiner

*Primary Examiner* — Dzung Tran
(74) *Attorney, Agent, or Firm* — Pramudji Law Group PLLC; Ari Pramudji

(57) ABSTRACT

Various implementations described herein are directed to an integrated circuit with mitigated resistance. The integrated circuit may include a cell having a plurality of transistors including a first transistor of a first type and a second transistor of a second type that is different from the first type. The integrated circuit may include a first wire coupling the first transistor to the second transistor. The integrated circuit may include a second wire coupling the first wire to an output routing wire. The integrated circuit may include a redundant wire further coupling the first wire to the output routing wire.

13 Claims, 12 Drawing Sheets

US 9,871,039 B2

1

RESISTANCE MITIGATION IN PHYSICAL DESIGN

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in physical design, performance and reliability at advanced process nodes may be limited by an increase of metal resistance and via resistance as metal wires are scaled down. For instance, as metal wire width decreases, its resistance increases along with resistance of vias connecting metal wires together. Further, narrower metal wires may be sensitive to electromigration as current density increases.

In reference to physical design, FIGS. 1A-1C illustrate various diagrams of a conventional layout of a cell 100 as known in the art. In particular, FIG. 1A refers to the cell 100 with current flow during output load charge 100A, FIG. 1B refers to the cell 100 with current flow during output load discharge 100B, and FIG. 1C refers to an equivalent resistive circuit of the cell 100 with current flow during output load charge 100C.

In reference to advanced process nodes (e.g., <28 nm), a p-type field effect transistor (PFET) 110 may be coupled to an n-type FET (NFET) 112 using a local metal interconnect M0. Further, M0 may also be used to couple to VSS and VDD power rails. Another metal interconnect M1 may be an output pin of the cell 100 that may be extended in one direction (i.e., a first direction) and may be coupled to M0 using a via V0. Generally, in advanced process nodes, the output pin M1 may not be allowed to extend in a second direction (unidirectional route) that is opposite the first direction. The M1 output pin may also be coupled to other cells using a via V1 and another metal interconnect M2 during a routing step. Generally, M2 may only extend in a direction perpendicular to M1, and in advanced process nodes, M2 may not be allowed to extend in the second direction (unidirectional route). Further, whether active high or low, an activated gate (net input) allows current to flow through the transistors 110, 120 depending on type.

FIGS. 1A-1B describe different connections and resistance modeling of the cell 100. As shown, an output net resistance from M0 may be composed of V0+M1+V1+M2. Also, the M1 output pin should be implemented to sustain the current flow without significant electromigration degradation. FIG. 1A shows arrows to indicate the current flow during output load charge, e.g., when M0 (as output net coupling the NFET to the PFET) switches from 0 to 1. Further, FIG. 1B shows arrows to indicate the current flow during the output load discharge, e.g., when M0 (as the output net coupling the NFET to the PFET) switches from 1 to 0.

FIG. 1C shows an equivalent resistive network from M0 (as the output net coupling the NFET to the PFET) of the cell 100 with current flow during output load charge 100C. As shown, $R_{V0}, R_{M1}, R_{V1}, R_{M2\_1}$ and $R_{M2\_2}$ are respectively V0, M1, V1 and M2 resistances. In this instance, current may be split between the M2 resistances. Therefore, total resistance between M0 and M2 may be: $R_1 = R_{V0} + R_{M1} + R_{V1}$.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to resistance mitigation in physical design and a standard cell layout for improved yield, output net resistance, and electromigration. For instance, resistance of various types of circuit components (e.g., cells, standard cells, transistors, etc.) may be modified and/or reduced to improve circuit performance in physical design. In this instance, current flow during output load charge and discharge may be improved with redundant wiring, which may provide higher speed with reduced timing delay. In some cases, resistance may be decreased using a specific cell layout that adds redundant output wires. As described herein, a specific cell layout may be used to improve manufacturing yield and cell output net resistance, thus providing higher performance and reducing cell sensitivity to metal electromigration. This technique may improve performance of circuit components (e.g., cells, standard cells, transistors, etc.) when implemented in an integrated circuit.

Accordingly, various implementations of integrated circuits and methods for mitigating resistance in physical design will now be described in greater detail herein with reference to FIGS. 2A-5.

In reference to physical design, FIGS. 2A-2E illustrate various diagrams of a layout of a cell 200 for mitigating resistance in physical design in accordance with various implementations described herein. In particular, FIG. 2A refers to the layout of the cell 200 with arrows showing current flow during output load charge 200A, FIG. 2B refers to the layout of the cell 200 with arrows showing current flow during output load discharge 200B, and FIG. 2C refers to an equivalent resistive circuit 200C of the layout of the cell 200 with arrows showing current flow during output load charge. Further, FIG. 2D refers to another layout of the cell 200 with arrows showing current flow during output load charge 200D, and FIG. 2E refers to another layout of the cell 200 with arrows showing current flow during output load discharge 200E.

Figure 1A:
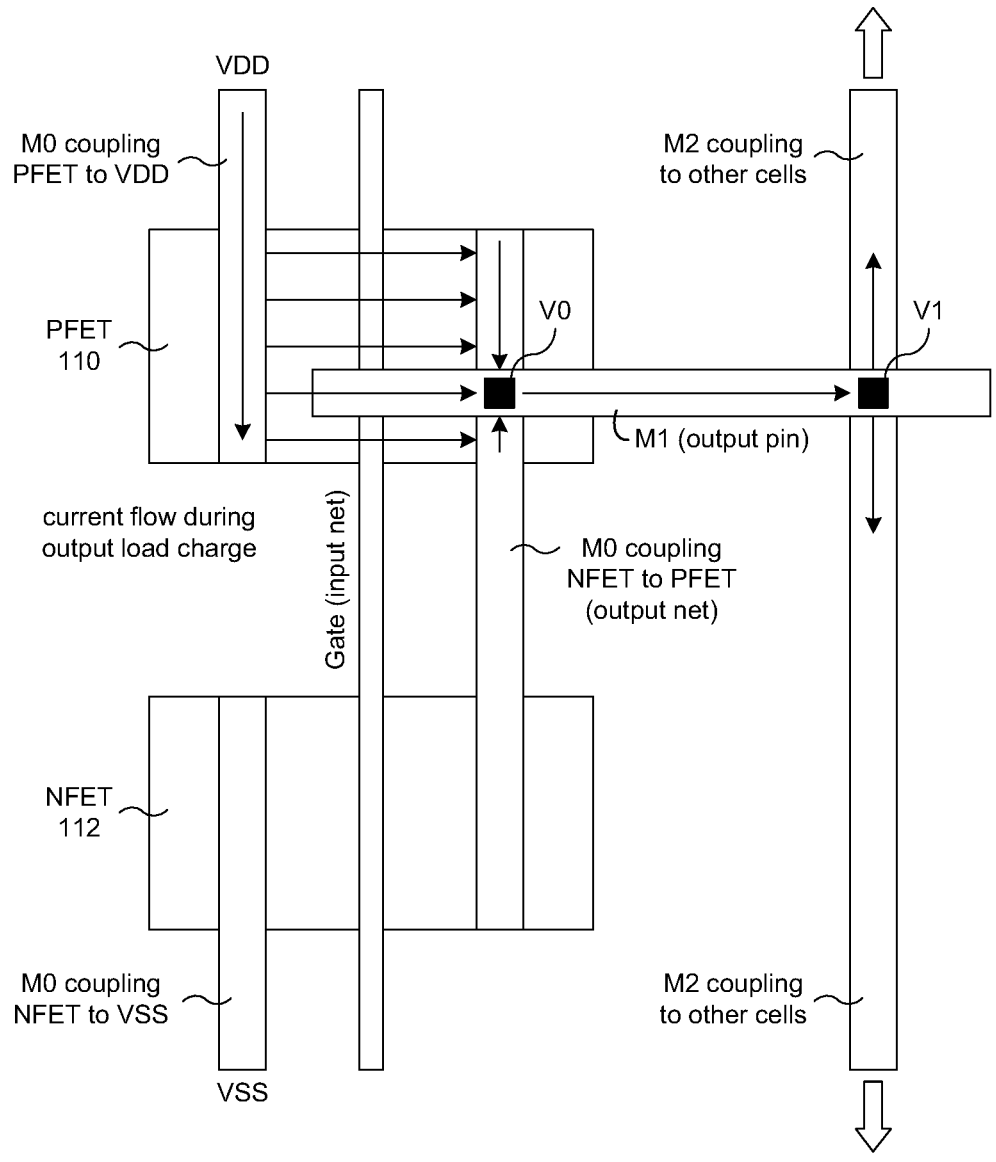
FIGS. 1A-1C illustrate diagrams of a cell layout as known in the art.
Figure 1B:
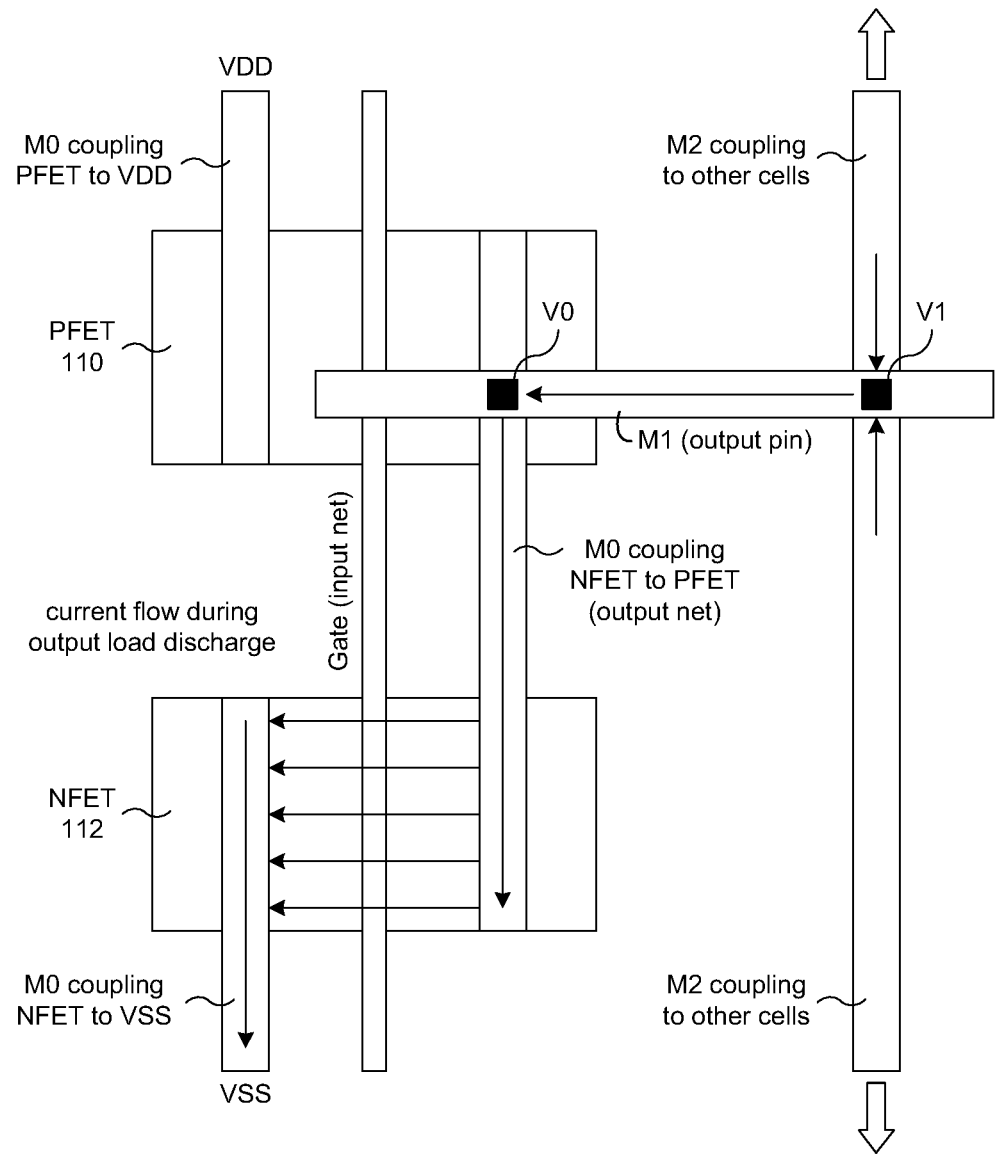
Figure 1C:
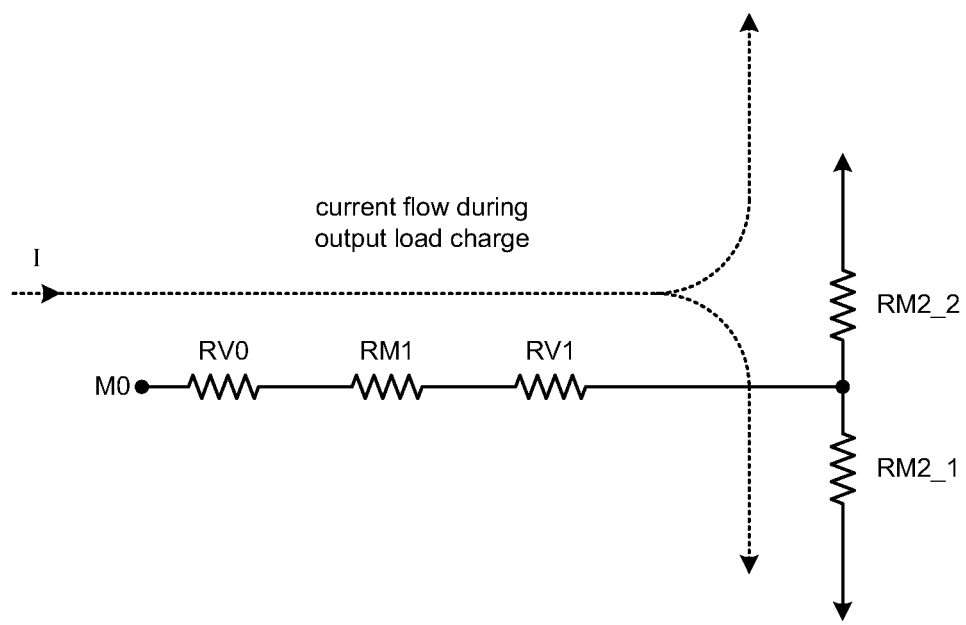
Figure 2A:
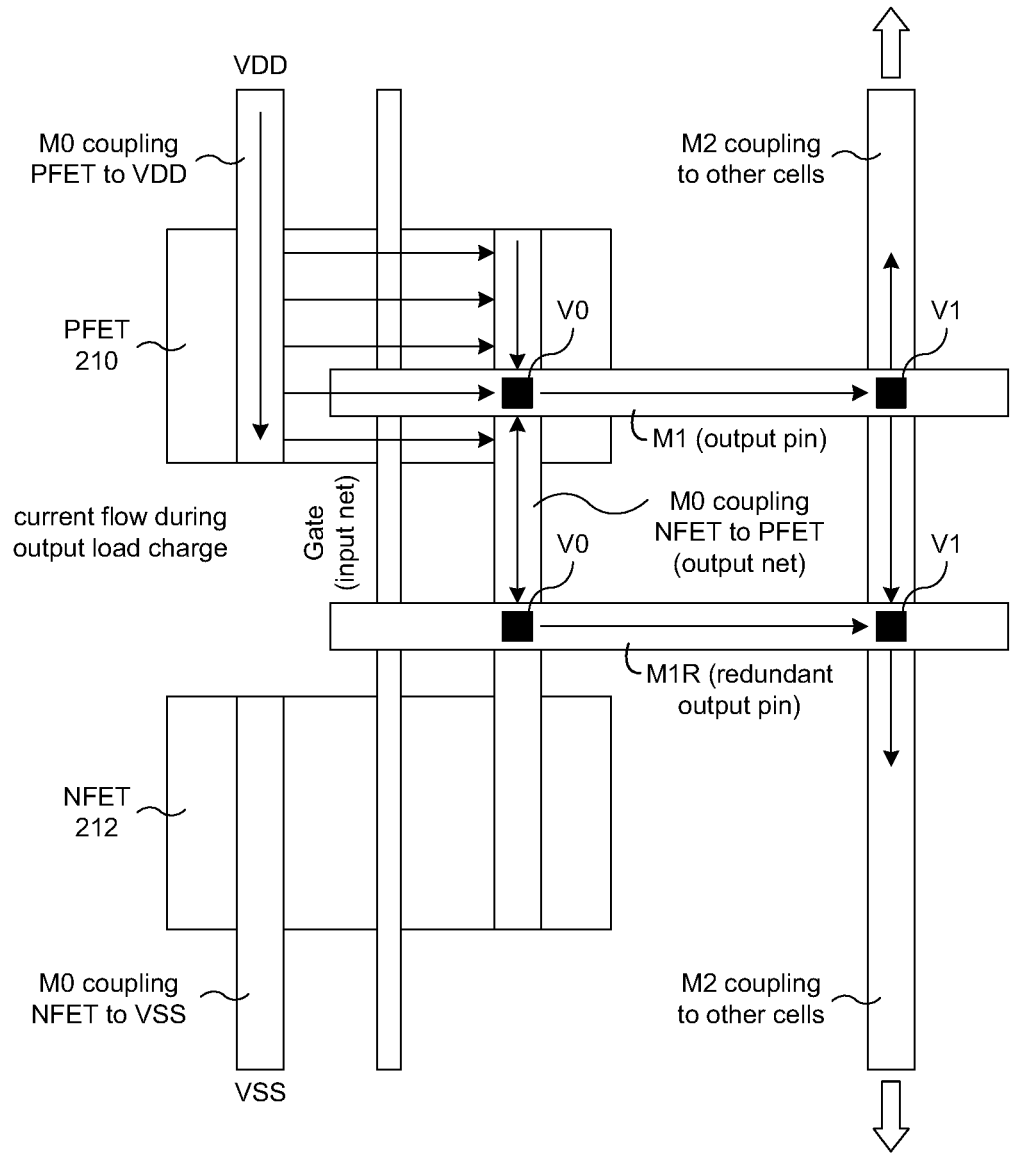
FIGS. 2A-2E illustrate diagrams of a cell layout for mitigating resistance in physical design in accordance with various implementations described herein.

In reference to FIG. 2A, a standard cell layout of an integrated circuit is shown with an instance of the cell 200. The cell 200 may include a plurality of transistors 210, 212 including a first transistor 210 of a first type (e.g., p-type) and a second transistor 212 of a second type (e.g., n-type) that is different from the first type. The cell 200 may include a first wire M0 coupling the first transistor 210 to the second transistor 212. The cell 200 may include a second wire M1 (output pin) coupling the first wire M0 to an output routing wire M2. The cell 200 may include a redundant wire M1R (redundant output pin) further coupling the first wire M0 to the output routing wire M2. The second wire M1 provides a first conductive path or branch to the output routing wire M2, and the redundant wire M1R provides a second path or branch to the output routing wire M2. The output routing wire M2 couples the cell 200 to one or more other cells in a cell network.

In some implementations, the first transistor 210 may be a p-type field effect transistor (PFET), and the second transistor 212 may be an n-type FET (NFET). The first wire M0 may include a first metal wire that electrically couples the first transistor 210 to the second transistor 212. The first wire M0 may include one or more additional wires that electrically couple the first transistor 210 to a first power rail having a first polarity and electrically couple the second transistor 212 to a second power rail having a second polarity that is different than the first polarity. Further, the first power rail may provide a first voltage at the first polarity, such as, e.g., a source voltage (VDD), and the second power rail may provide a second voltage at the second polarity, such as, e.g., a ground voltage (VSS or GND).

In some implementations, the first wire M0 may be disposed parallel to the output routing wire M2, and the second wire M1 may be disposed perpendicular to the first wire M0 and the output routing wire M2. The redundant wire M1R may be disposed parallel to the second wire M1. In some cases, the redundant wire M1R may include a plurality of redundant wires (e.g., disposed parallel to the second wire M1) electrically coupling the first wire M1 to the output routing wire M2 to thereby provide a plurality of conductive paths or branches to the output routing wire M2.

As shown with arrows in FIG. 2A, during output load charge, current flows through the first transistor 210 to the output routing wire M2 via the first wire M0, the second wire M1, and the redundant wire M1R. Further, during output load charge, the second transistor 212 may be inactive.

Figure 2B:
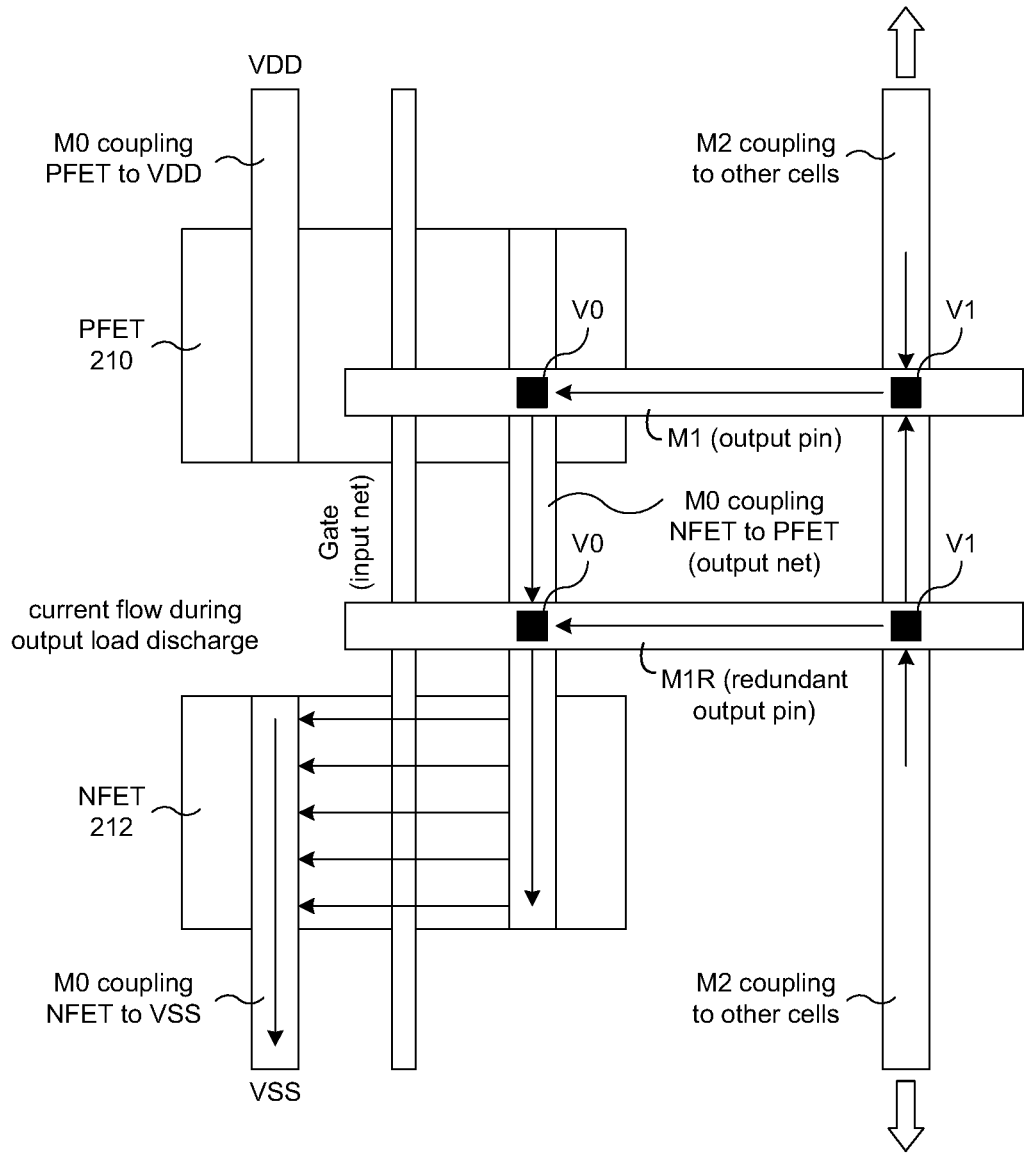

As shown with arrows in FIG. 2B, during output load discharge, current flows from the output routing wire M2 through the second transistor 212 via the first wire M0, the second wire M1, and the redundant wire M1R. Further, during output load discharge, the first transistor 210 may be inactive.

During output load charge and/or discharge, the redundant wire M1R may decrease an output net resistance of the cell 200. In various implementations, during output load charge and/or discharge, the redundant wire M1R may reduce sensitivity of the cell 200 to electromigration as current through the cell 200 is split between the second wire M1 and the redundant wire M1R.

In some implementations, each of the wires M0, M1, M1R, M2 (e.g., metal interconnects) may be formed on different levels of interconnect and coupled together vertically with vias V0, V1 (e.g., metal vias) in a manner as shown in FIGS. 2A-2B. In the generalized concept, each layer in a network may have multiple parallel geometries. For adjacent layers, this may result in multiple intersection points for vias (or cuts in the general case). In some cases, this may assist with performance and electromigration. Further, these layers may exhibit a resistive issue, resulting in possibly a small amount of capacitance relative to total capacitance, which may or may not affect performance.

As shown in FIGS. 2A-2B, various implementations described herein refer to and are directed to decreasing resistances of the cell 200 using a specific layout adding redundant parallel output pins M1, M1R. Further, the configuration of the cell 200 in FIGS. 2A, 2B leads to an equivalent resistive network of FIG. 2C. For simplicity, M2 resistance between vias V1 have been omitted from FIG. 2C, because this resistance may be neglected in some practical cases.

Figure 2C:
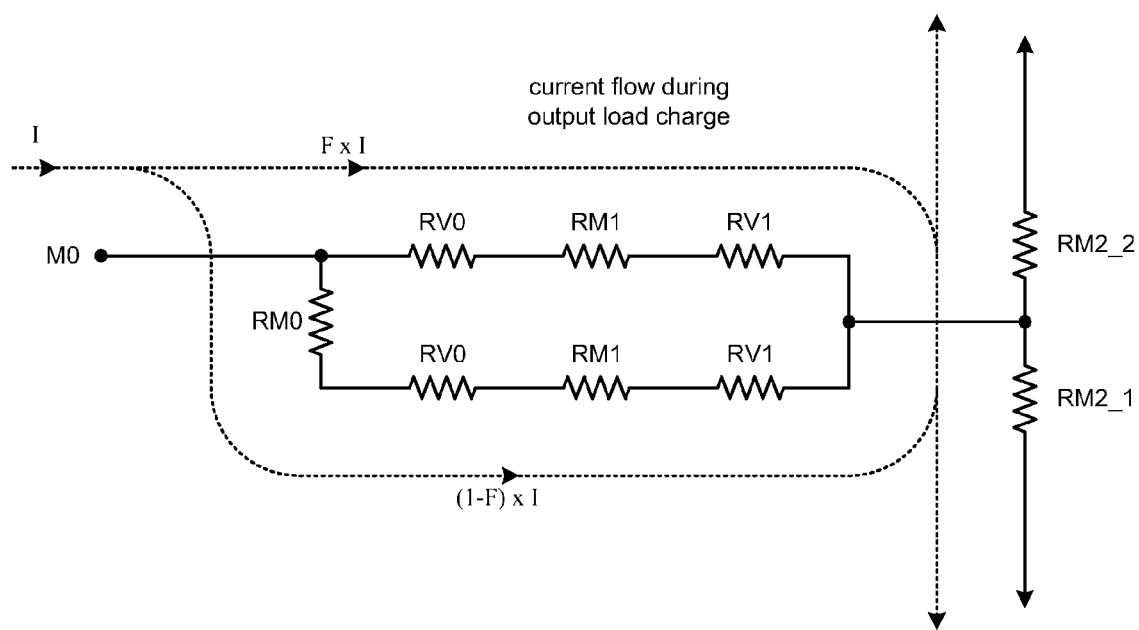

As shown in FIGS. 2A-2C, the current is split between two parallel branches M1, M1R having similar V0, M1, and V1 resistances. The additional $R_{M0}$ resistance may correspond to the M0 portion disposed between the two vias V0. In this instance, the total resistance between M0 and M2 is:

$$R_2 = R_1(R_{M0}+R_1)/(R_{M0}+2R_1)$$

which may also be written as:

$$R_2 = R_1(1+r)/(2+r), \text{with } r=R_{M0}/R_1$$

The total resistance between M0 and M2 has thus been reduced from R1 to R2. The reduction factor F is:

$$F = R_2/R_1 = (1+r)/(2+r)$$

The reduction factor is 0.5 in the ideal case where $R_{M0}=0$ (r=0). In some cases, the lower the $R_{M0}$ value, the better the reduction factor. $R_{M0}$ may be minimized by minimizing the distance between the two M1 output pins.

Further, the current is split between the two redundant M1, M1R output pins, wherein the largest fraction flows in the branch without $R_{M0}$ corresponding to F, and the smallest fraction flows in the branch with $R_{M0}$ corresponding to (1−F). As the current in each redundant MR1 output pin is smaller than the current for non-redundant M1 output pin, the redundant M1R output pin configuration is less sensitive to electromigration.

In some implementations, the two redundant output pins M1, M1R case may be extrapolated to multiple (two or more) redundant output pins, where additional parallel output pins may be included as long as the cell 200 offer enough space to accommodate them. Increasing the number of redundant output pins may further decrease output net resistance and may further reduce sensitivity to electromigration. Accordingly, the above resistance formula may be generalized to multiple redundant output pins.

For instance, for a total number of (N+1) output pins in parallel corresponding to N M0 segments, total resistance between M0 and M2 may be calculated from:

$$\frac{1}{R_2} = \frac{1}{R_1} + \frac{1}{R_{01}}$$

where $R_{01}$ is calculated using the following recurrent formula:

$$R_{0i} = R_{M0i} + \left(\frac{1}{R_1} + \frac{1}{R_{0i+1}}\right)^{-1}$$

and:

$$R_{0N} = R_{M0N} + R_1$$

The reduction factor can be deduced from:

$$F = \frac{R_2}{R_1} = \frac{1}{1+\frac{R_1}{R_{01}}}$$

To illustrate a generalized formula, the two redundant output pin case described above, corresponding to N+1=2 or N=1 is calculated as:

$$R_{01} = R_{M0} + R_1$$

yielding:

$$\frac{1}{R_2} = \frac{1}{R_1} + \frac{1}{R_{01}} = \frac{1}{R_1} + \frac{1}{R_{M0} + R_1} = \frac{R_{M0} + 2R_1}{R_1(R_{M0} + R_1)}$$

equivalent to the above formula:

$$R_2 = \frac{R_1(R_{M0} + R_1)}{R_{M0} + 2R_1}$$

Illustrating a three redundant output pin case (N=2), two M0 portions with $R_{M01}$ and $R_{M02}$ resistances are now accounted for between the V0s. In this instance, the generalized formula translates to:

$$R_{02} = R_{M02} + R_1$$

$$R_{01} = R_{M01} + \left(\frac{1}{R_1} + \frac{1}{R_{02}}\right)^{-1} = R_{M01} + \frac{R_1(R_1 + R_{M02})}{R_{M02} + 2R_1}$$

$$\frac{1}{R_2} = \frac{1}{R_1} + \frac{1}{R_{01}} = \frac{1}{R_1} + \frac{R_{M02} + 2R_1}{R_{M01}R_{M02} + 2R_1R_{M01} + R_1^2 + R_1R_{M02}}$$

The use of multiple output redundant pins implies the use of redundant V0 and V1, this configuration may then improve the manufacturing yield. For the non-redundant output pin case, a failing V0 or V1 (V0 or V1 not contacting their bottom or top metal layers or having high resistance value) may cause a non-functionality.

Figure 3A:
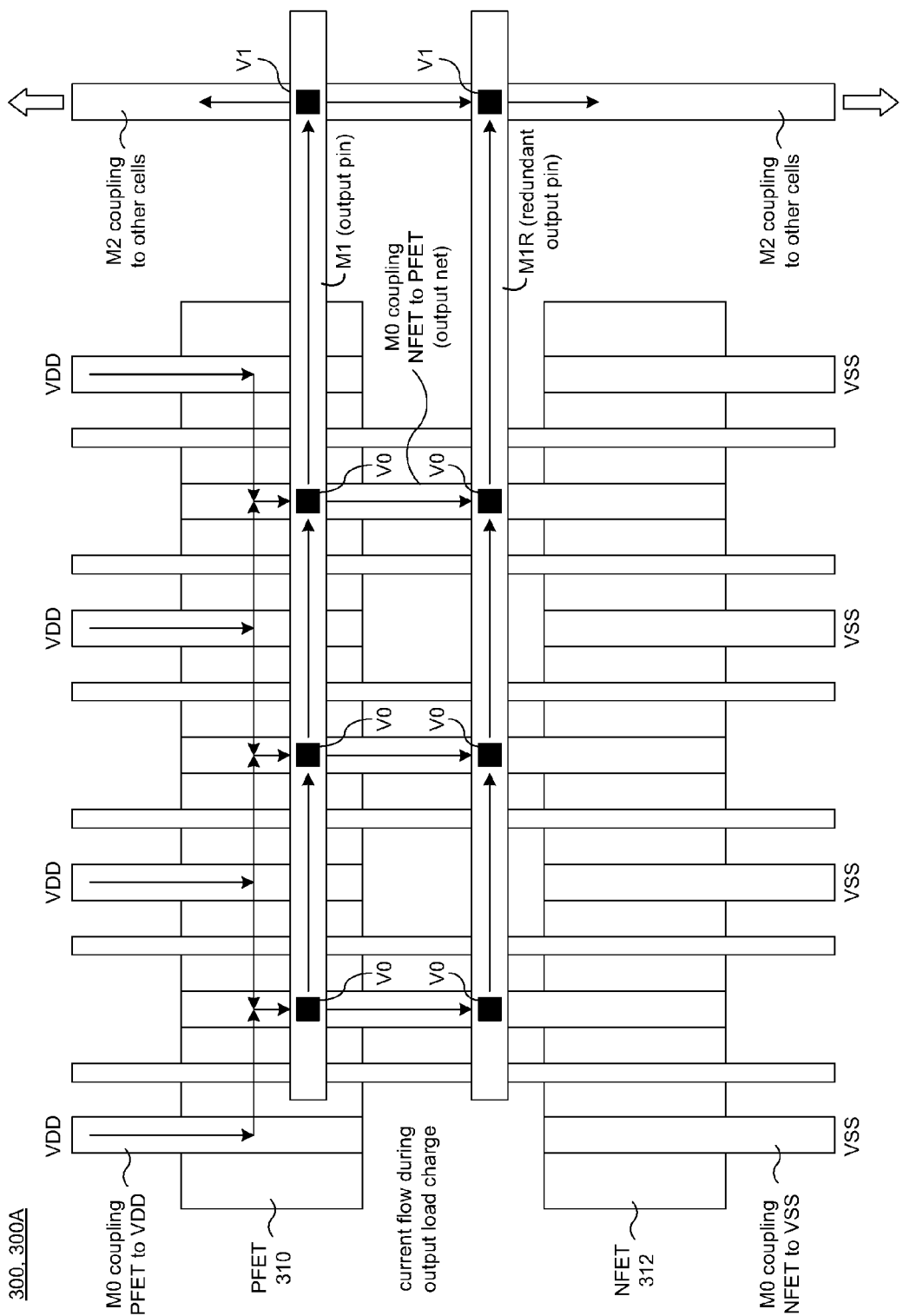
FIGS. 3A-3B illustrate diagrams of a multi-finger cell layout for mitigating resistance in physical design in accordance with various implementations described herein.
Figure 3B:
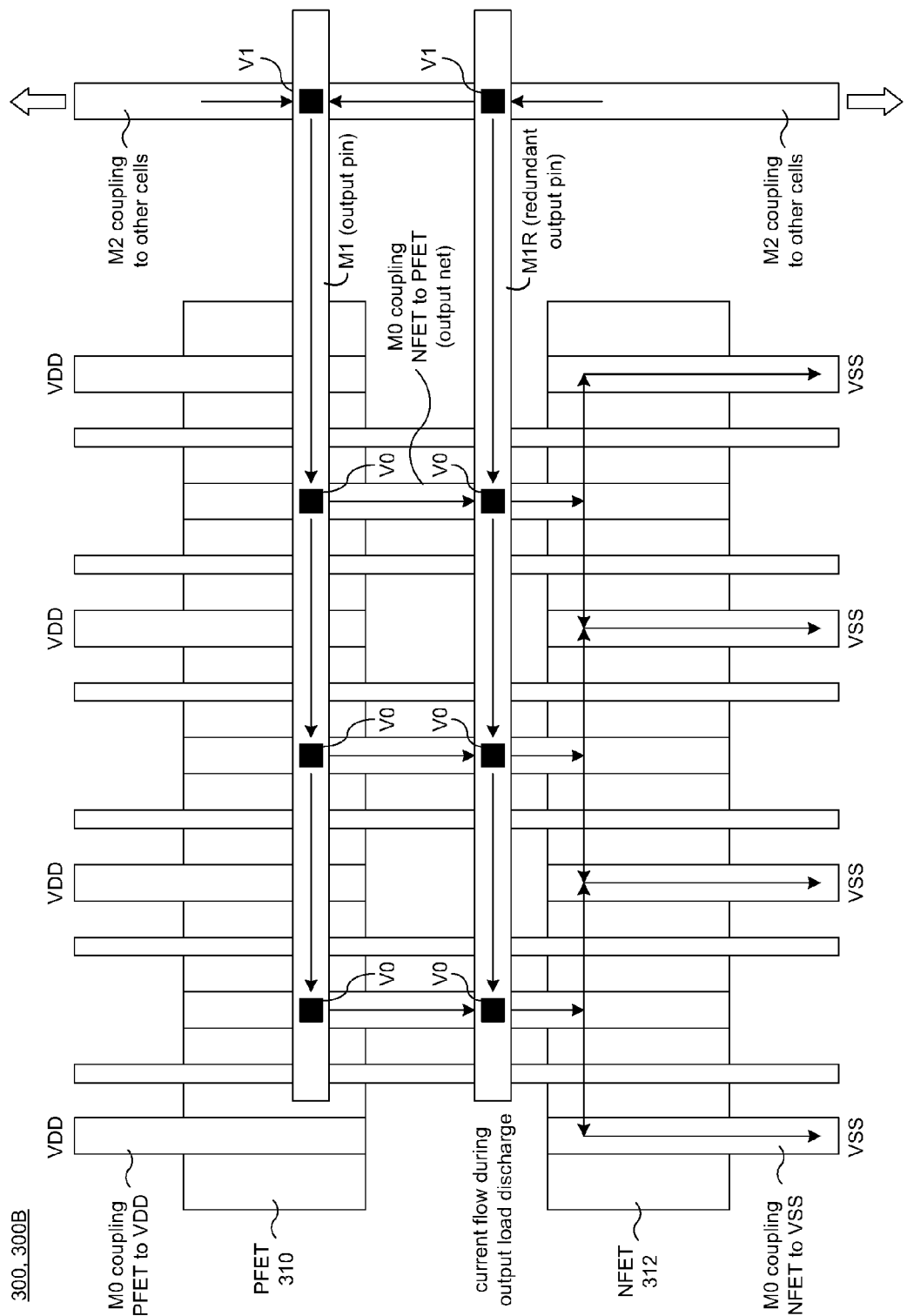

The previous illustration of FIGS. 2A-2C shows a single finger PFET/NFET to describe techniques as described herein. In practice, the current may be collected from multiple fingers in parallel, e.g., as shown in FIGS. 3A-3B. For instance, FIGS. 3A-3B illustrate a diagram of a multi-finger cell layout of a cell 300 for mitigating resistance in physical design in accordance with various implementations described herein. In particular, FIG. 3A refers to the multi-finger cell layout of the cell 300 with arrows showing current flow during output load charge 300A, and FIG. 3B refers to the multi-finger cell layout of the cell 300 with arrows showing current flow during output load discharge 300B.

Figure 2D:
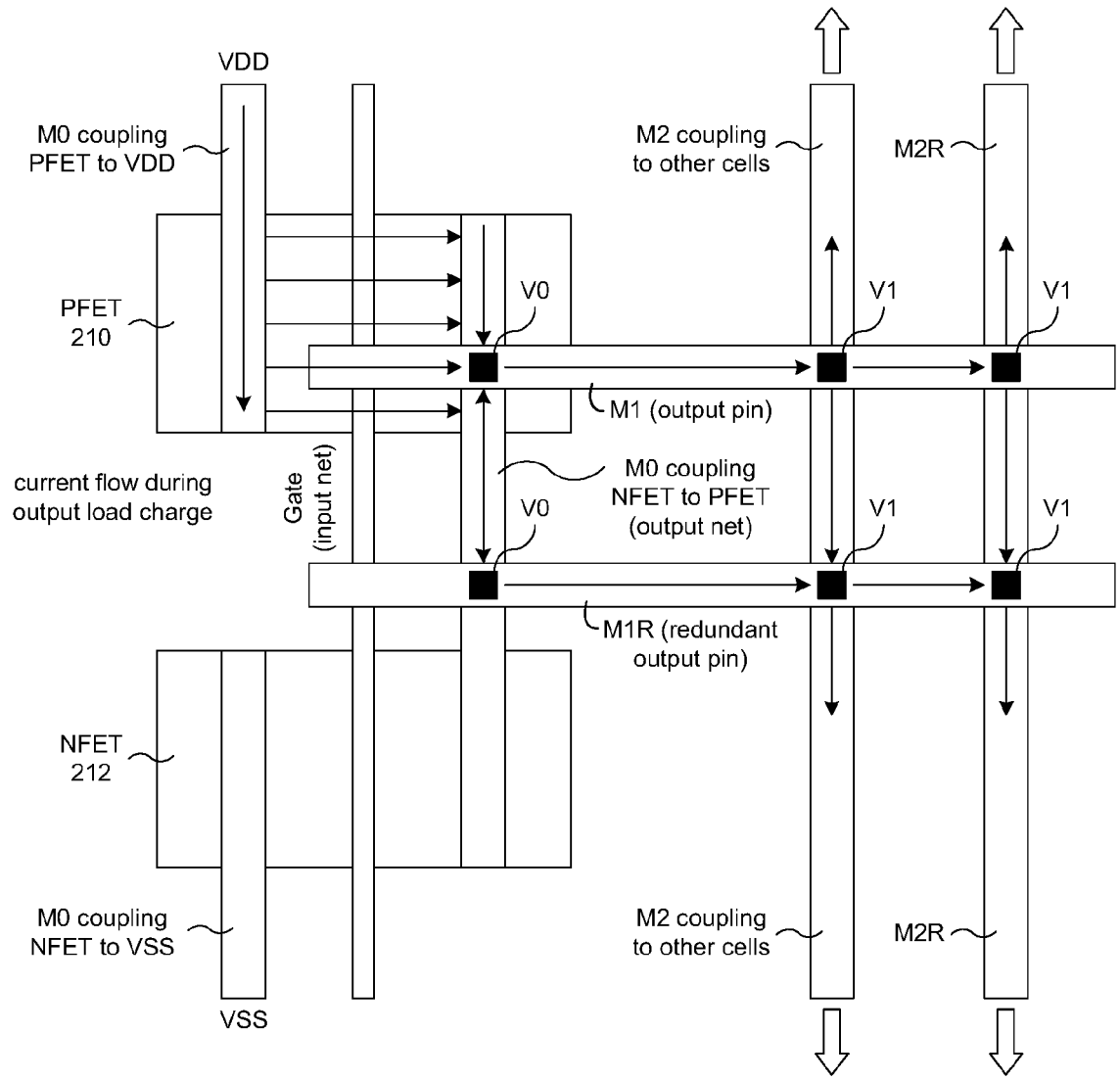
Figure 2E:
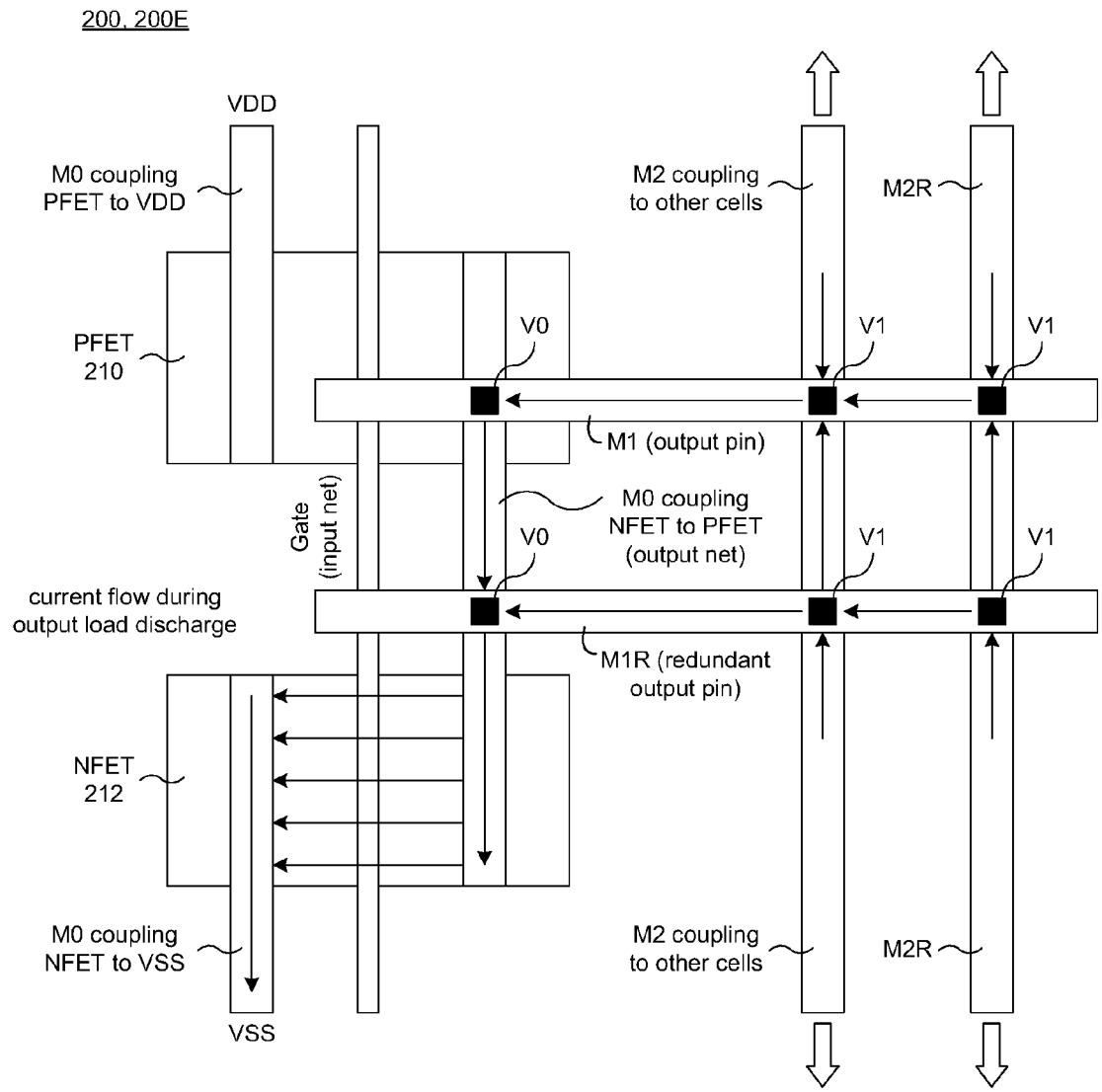

In reference to FIGS. 2D-2E, the standard cell layout of an integrated circuit is shown with other instances of the cell 200, where similar features provide similar scope and operation as described in reference to FIGS. 2A-2B. Further, as described herein, the second wire M1 provides a first conductive path or branch to the output routing wire M2, and the redundant wire M1R provides a second path or branch to the output routing wire M2. The output routing wire M2 couples the cell 200 to one or more other cells in a cell network. In some implementations, as shown in reference to FIG. 2D-2E, the cell 200 may include a redundant output routing wire M2R. The redundant output routing wire M2R further couples the cell 200 to one or more other cells in a cell network. Further, the redundant output routing wire M2R may be disposed parallel to the output routing wire M2, and the second wire M1 may be disposed perpendicular to the first wire M0 and the redundant output routing wire M2R. The redundant output routing wire M2R may include a plurality of redundant output routing wires (e.g., disposed parallel to the output routing wire M2) to thereby provide a plurality of conductive paths or branches to one or more other cells in a cell network along with the output routing wire M2.

As shown with arrows in FIG. 2D, during output load charge, current flows through the first transistor 210 to the output routing wires M2, M2R via the first wire M0, the second wire M1, and the redundant wire M1R. During output load charge, the second transistor 212 may be inactive.

As shown with arrows in FIG. 2E, during output load discharge, current flows from the output routing wires M2, M2R through the second transistor 212 via the first wire M0, the second wire M1, and the redundant wire M1R. During output load discharge, the first transistor 210 may be inactive.

During output load charge and/or discharge, the one or more redundant output routing wires M2R along with the output routing wire M2 may decrease an output net resistance of the cell 200. In various implementations, during output load charge and/or discharge, the one or more redundant output routing wires M2R along with the output routing wire M2 may reduce sensitivity of the cell 200 to electromigration as current through the cell 200 is split between the output routing wire M2 and the one or more redundant output routing wires M2R.

As described herein, the output routing wire M2 may include a plurality of output routing wires that are parallel to each other. The one or more redundant output routing wires M2R may be part of the plurality of output routing wires M2 that are parallel to each other. Further, the second wire M1 and the redundant wire M1R may be coupled to each of the plurality of output routing wires M2, M2R. In some implementations, the output routing wires M2, M2R may be formed at multiple levels of interconnect, wherein each level of interconnect includes at least two parallel wires. Further, each level of interconnect may be coupled to a previous level of interconnect below by multiple vias (e.g., by at least four vias) and coupled to a next level of interconnect above by multiple vias (e.g., at least two vias).

In reference to FIGS. 3A-3B, a multi-finger cell layout of an integrated circuit is shown with an instance of the cell 300. The cell 300 may include a plurality of transistors 310, 312 including a first transistor 310 of a first type (e.g., PFET) and a second transistor 312 of a second type (e.g., NFET) that is different from the first type. As shown, each of the PFET 310 and the NFET 312 have multiple fingers, wherein the cell 300 may include the first wire M0 coupling the multiple fingers of the PFET 310 to corresponding multiple fingers of the NFET 312. The cell 300 may include the second wire M1 (output pin) coupling the first wire M0 to the output routing wire M2. The cell 300 may include the redundant wire M1R (redundant output pin) further coupling the first wire M0 to the output routing wire M2. As described herein, the second wire M1 provides a first conductive path or branch to the output routing wire M2, and the redundant wire M1R provides a second path or branch to the output routing wire M2. The output routing wire M2 couples the cell 300 to one or more other cells in a cell network.

Further, as shown with arrows in FIG. 3A, during output load charge, current flows through the fingers of the PFET 310 to the output routing wire M2 via the first wire M0, the second wire M1, and the redundant wire M1R. During output load charge, the NFET 312 may be inactive.

As shown with arrows in FIG. 3B, during output load discharge, current flows from the output routing wire M2 through the NFET 312 via the first wire M0, the second wire M1, and the redundant wire M1R. Further, during output load discharge, the PFET 310 may be inactive.

During output load charge and/or discharge, the redundant wire M1R may decrease an output net resistance of the cell 300. In various implementations, during output load charge and/or discharge, the redundant wire M1R may reduce sensitivity of the cell 300 to electromigration as current through the cell 300 is split between the second wire M1 and the redundant wire M1R.

Various implementations described herein are directed to a standard cell layout using multiple redundant parallel M1, M1R output pins. In some cases, this configuration enables a decrease in the output net resistance thus improving timing performance. In some other cases, this configuration enables an improvement in manufacturing yield due to an increase of redundant vias. In still some other cases, this configuration enables a reduction in sensitivity to electromigration as total current is split in multiple different paths or branches, and each path or branch collects a fraction of the total current.

Figure 4:
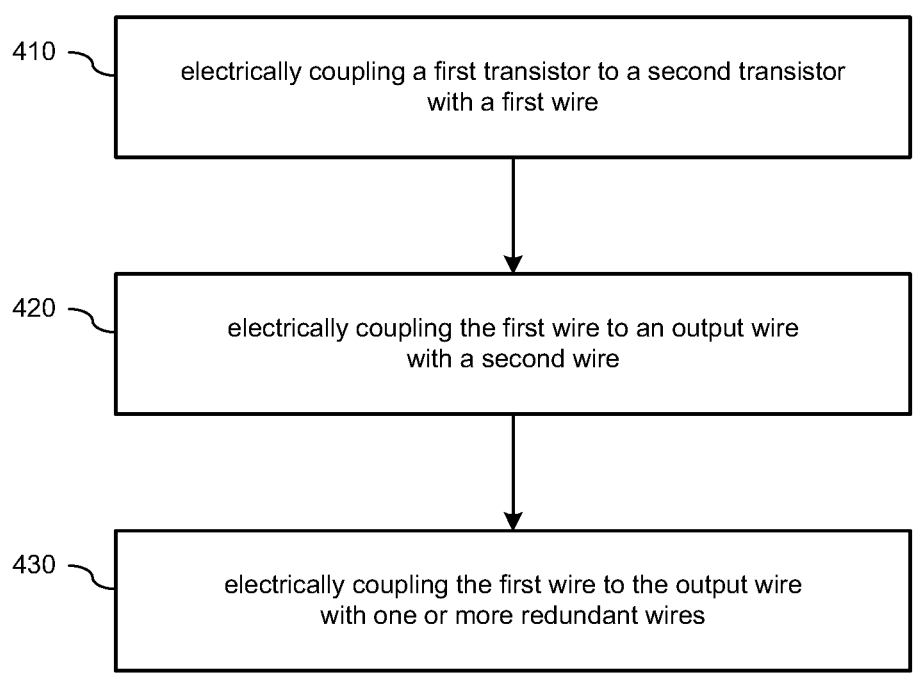
FIG. 4 illustrates a process flow diagram of a method for mitigating resistance in physical design in accordance with various implementations described herein.

FIG. 4 illustrates a process flow diagram of a method for mitigating resistance in physical design in accordance with various implementations described herein. It should be understood that even though method 400 indicates a particular order of execution of operations, in some instances, certain portions of the operations may be executed in a different order, and on different systems. In other instances, additional operations or steps may be added to and/or omitted from method 400. Further, computing device 400 of FIG. 4 may be configured to perform method 400. In some implementations, method 400 may be implemented as a program or software instruction process configured to mitigate resistance in physical design to improve performance.

At block 410, method 400 may electrically couple a first transistor to a second transistor with a first wire. At block 420, method 400 may electrically couple the first wire to an output wire with a second wire. At block 430, method 400 may electrically couple the first wire to the output wire with one or more redundant wires.

In some implementations, method 400 may refer to a method of fabricating an integrated circuit. During output load charge and/or discharge, the one or more redundant wires may decrease an output net resistance of the integrated circuit. Further, in some cases, during output load charge and/or discharge, the one or more redundant wires may reduce sensitivity of the integrated circuit to electromigration as current is split between the second wire and the one or more redundant wires.

Figure 5:
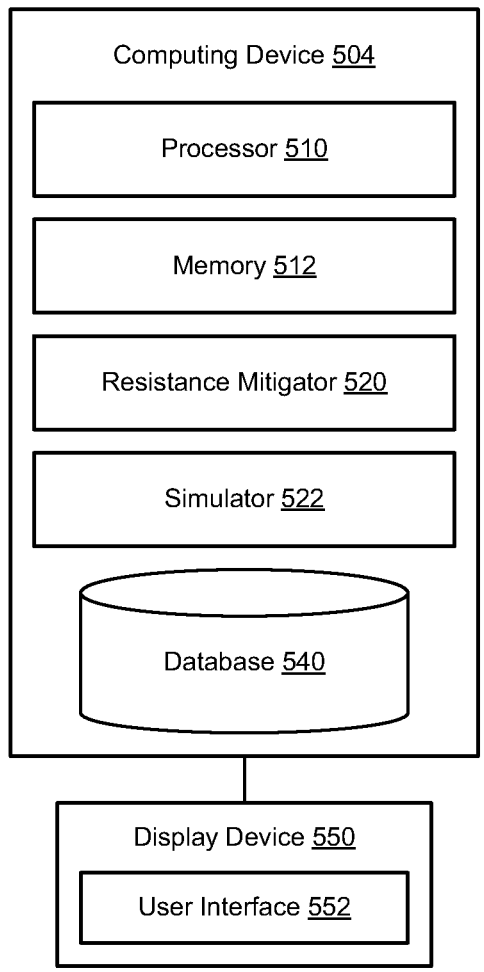
FIG. 5 illustrates a diagram of a system for mitigating resistance in physical design in accordance with various implementations described herein.

FIG. 5 illustrates a block diagram of a system 500 for mitigating resistance in physical design in accordance with various implementations described herein. Further, the system 500 may be configured for fabricating an integrated circuit with cells having a standard cell layout with improved yield, output net resistance, and electromigration in accordance with various implementations described herein.

In reference to FIG. 5, the system 500 may include a computer based system configured to mitigate resistance in physical design. The system 500 may be associated with at least one computing device 504 that is implemented as a special purpose machine configured to mitigate resistance in physical design, as described herein. In some implementations, the computing device 504 may include any standard element(s) and/or component(s), including at least one processor(s) 510, memory 512 (e.g., non-transitory computer-readable storage medium), one or more database(s) 540, power, peripherals, and various other computing elements and/or components that may not be specifically shown in FIG. 5. The computing device 504 may include instructions stored on the non-transitory computer-readable medium 512 that are executable by the at least one processor 510. The computing device 504 may be associated with a display device 550 (e.g., a monitor or other display) that may be used to provide a user interface (UI) 552, such as, e.g., a graphical user interface (GUI). In some instances, the UI 552 may be used to receive various parameters and/or preferences from a user for managing, operating, and/or utilizing the computing device 504. As such, the computing device 504 may include the display device 550 for providing output to a user, and the display device 550 may include the UI 552 for receiving input from the user.

In various implementations, the computing device 504 may be configured to implement various methodologies and/or techniques for mitigating resistance in physical design. For instance, the computing device 504 may be configured to analyze operating conditions for cells of an integrated circuit. Further, in reference to FIG. 5, the computing device 504 may include a resistance mitigator module 520 (or layout optimizer) configured to cause the at least one processor 510 to implement one or more techniques described in reference to FIGS. 2A-4, including techniques related to resistance mitigation in physical design and a standard cell layout for improved yield, output net resistance, and electromigration. The resistance mitigator module 520 may be implemented in hardware and/or software. If implemented in software, the resistance mitigator module 520 may be stored in memory 512 and/or database 540. If implemented in hardware, the resistance mitigator module 520 may be a separate processing component configured to interface with the processor 510.

In various implementations, the resistance mitigator module 520 may be configured to cause the at least one processor 510 to perform various techniques, as described herein in reference to FIGS. 2A-4. For instance, resistance mitigator module 520 may be configured to cause the at least one processor 510 to analyze operating conditions for cells of an integrated circuit. The resistance mitigator module 520 may be configured to cause the at least one processor 510 to assist with fabricating an integrated circuit having one or more cells as described in reference to FIGS. 2A-3.

For instance, in reference to method 400 of FIG. 4, the resistance mitigator module 520 may be configured to cause the at least one processor 510 to assist with fabricating an integrated circuit with one or more cells having a first transistor of a first type and a second transistor of a second type that is different than the first type. The integrated circuit may include a first interconnect electrically coupling the first and second transistors. Further, the integrated circuit may include a plurality of second interconnects electrically coupling the first interconnect to an output routing connection by disposing a plurality of conductive branches between the first interconnect and the output routing connection. The first interconnect may be parallel to the output routing connection, and the plurality of second interconnects may be disposed perpendicular to the first interconnect and the output routing connection. During output load charge and discharge, the plurality of second interconnects may decrease an output net resistance of the integrated circuit. Still further, during output load charge and discharge, the plurality of second interconnects may reduce sensitivity of the integrated circuit to electromigration as current is split between the plurality of second interconnects.

Moreover, in reference to FIG. 5, the computing device 504 may include a simulator module 522 configured to cause the at least one processor 510 to generate one or more simulations of the integrated circuit. The simulator module 522 may be referred to as a simulating component that may be implemented in hardware and/or software. If implemented in software, the simulator module 522 may be stored in memory 512 or database 540. If implemented in hardware, the simulator module 520 may be a separate processing component configured to interface with the processor 510. In some instances, the simulator module 522 may include a SPICE simulator configured to generate SPICE simulations of the integrated circuit. Generally, SPICE refers to an acronym for Simulation Program with Integrated Circuit Emphasis, which is an open source analog electronic circuit simulator. Further, SPICE is a general-purpose software program used by the semiconductor industry to check the integrity of integrated circuit designs and to predict the behavior of integrated circuit designs. Therefore, in some instances, the resistance mitigator module 520 may be configured to interface with the simulator module 522 to generate timing data based on one or more simulations (e.g., SPICE simulations) of an integrated circuit that may be used for analyzing the timing data of the integrated circuit to identify instances of timing degradation. Further, the resistance mitigator module 520 may be configured to use the one or more simulations (including, e.g., SPICE simulations) of an integrated circuit for assisting with resistance mitigation in physical design and with a standard cell layout for improved yield, output net resistance, and electromigration, as described herein.

In some implementations, the computing device 504 may include one or more databases 540 configured to store and/or record various information related to mitigating resistance in physical design. In some instances, the database(s) 540 may be configured to store and/or record information related to the integrated circuit, operating conditions, and/or timing data. Further, the database(s) 540 may be configured to store and/or record information related to the integrated circuit and timing data in reference to simulation data (including, e.g., SPICE simulation data).

Described herein are various implementations of an integrated circuit. In some implementations, the integrated circuit may include a cell having a plurality of transistors including a first transistor of a first type and a second transistor of a second type that is different from the first type. The integrated circuit may include a first wire coupling the first transistor to the second transistor. The integrated circuit may include a second wire coupling the first wire to an output routing wire. The integrated circuit may include a redundant wire further coupling the first wire to the output routing wire.

Described herein are various implementations of an integrated circuit. In some implementations, the integrated circuit may include a first transistor of a first type, a second transistor of a second type that is different than the first type, and a first interconnect electrically coupling the first and second transistors. The integrated circuit may include a plurality of second interconnects electrically coupling the first interconnect to an output routing connection by disposing a plurality of conductive branches between the first interconnect and the output routing connection.

Described herein are various implementations of a method of fabricating an integrated circuit. In some implementations, the method may include electrically coupling first and second transistors with a first wire. The method may include electrically coupling the first wire to an output wire with a second wire. The method may include electrically coupling the first wire to the output wire with one or more redundant wires.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    a cell having a plurality of transistors including a first transistor of a first type and a second transistor of a second type that is different from the first type;
    a first wire coupling the first transistor to the second transistor, wherein the first wire is disposed in a first metal layer; and
    a plurality of wires coupling the first wire to an output routing wire, wherein the plurality of wires includes:
        a second wire coupling the first wire to the output routing wire, wherein the second wire is disposed in a second metal layer that is different than the first metal layer; and
        a redundant wire further coupling the first wire to the output routing wire, wherein the redundant wire is disposed in a third metal layer that is different than the first and second metal layers.

2. The integrated circuit of claim 1, wherein the first transistor comprises a p-type field effect transistor (PFET), and the second transistor comprises an n-type FET (NFET).

3. The integrated circuit of claim 1, wherein the first wire comprises a first metal wire that electrically couples the first transistor to the second transistor.

4. The integrated circuit of claim 1, wherein the first wire comprises additional wires that electrically couple the first transistor to a first power rail having a first polarity and electrically couple the second transistor to a second power rail having a second polarity that is different than the first polarity.

5. The integrated circuit of claim 1, wherein the first wire is parallel to the output routing wire, and wherein the second wire is disposed perpendicular to the first wire and the output routing wire.

6. The integrated circuit of claim 1, wherein the redundant wire is parallel to the second wire.

7. The integrated circuit of claim 1, wherein the redundant wire comprises a plurality of redundant wires electrically coupling the first wire to the output routing wire.

8. The integrated circuit of claim 1, wherein the output routing wire comprises a plurality of output routing wires that are parallel to each other, wherein the second wire is coupled to each of the plurality of output routing wires, and wherein the redundant wire is coupled to each of the plurality of output routing wires.

9. The integrated circuit of claim 8, wherein the plurality of output routing wires are formed at multiple levels of interconnect, wherein each level of interconnect includes at least two parallel wires, wherein each level of interconnect is coupled to a previous level of interconnect below by at least four vias and coupled to a next level of interconnect above by at least two vias.

10. The integrated circuit of claim 1, wherein during output load charge, current flows through the first transistor to the output routing wire via the first wire, the second wire, and the redundant wire, and wherein during output load charge, the second transistor is inactive.

11. The integrated circuit of claim 1, wherein during output load discharge, current flows from the output routing wire through the second transistor via the first wire, the second wire, and the redundant wire, and wherein during output load discharge, the first transistor is inactive.

12. The integrated circuit of claim 1, wherein during output load charge and discharge, the redundant wire decreases an output net resistance of the cell.

13. The integrated circuit of claim 1, wherein during output load charge and discharge, the redundant wire reduces sensitivity of the cell to electromigration as current through the cell is split between the second wire and the redundant wire.

* * * * *